United States Patent [19]
Morley

[11] Patent Number: 5,838,693
[45] Date of Patent: Nov. 17, 1998

[54] PARTIAL SCAN LOGIC

[75] Inventor: Sean P. Morley, Tarrytown, N.Y.

[73] Assignee: ATG Technology, Inc., Ramsey, N.J.

[21] Appl. No.: 856,942

[22] Filed: May 15, 1997

Related U.S. Application Data

[63] Continuation of Ser. No. 568,733, Dec. 5, 1995, abandoned.

[51] Int. Cl.$^6$ .................................................. G01R 31/28
[52] U.S. Cl. ...................................... 371/22.31; 371/22.5
[58] Field of Search ................................. 371/22.5, 22.6, 371/25.1, 22.1, 22.31, 22.32, 22.34, 22.36; 324/763

[56] References Cited

U.S. PATENT DOCUMENTS

| | | | |
|---|---|---|---|
| 4,602,210 | 7/1986 | Fasang et al. | 371/22.36 |
| 4,710,931 | 12/1987 | Bellay et al. | 371/22.35 |
| 4,860,290 | 8/1989 | Daniels et al. | 371/22.31 |
| 4,868,414 | 9/1989 | Kanazawa | 327/297 |
| 5,008,618 | 4/1991 | Van Der Star | 371/22.34 |
| 5,043,986 | 8/1991 | Agrawal et al. | 371/22.36 |
| 5,056,094 | 10/1991 | Whetsel | 371/25.1 |
| 5,132,974 | 7/1992 | Rosales | 371/22.36 |
| 5,150,044 | 9/1992 | Hashizume et al. | 371/22.36 |
| 5,317,205 | 5/1994 | Sato | 371/22.31 |
| 5,329,533 | 7/1994 | Lin | 371/22.32 |
| 5,367,551 | 11/1994 | Okumura et al. | 377/80 |
| 5,406,216 | 4/1995 | Millman et al. | 327/202 |
| 5,459,736 | 10/1995 | Nakamura | 371/22.36 |

OTHER PUBLICATIONS

Mano, "Computer System Architecture" 1982 pp. 45–47, $2^{nd}$ Edition, Prentice Hall, Inc. Englewood Cliffs, N.J.

Savant et al., "Electronic Circuit Design", The Benjamin/Cummings Publishing Company, Inc., pp. 748–752.

Mano, "Computer System Architecture" 1982 pp. 47–48.

Motorola Technical Data, "H4C Series Design Reference Guide," pp. 7–187, 7–188, 7–256 and 7–257.

Primary Examiner—Trinh L. Tu
Attorney, Agent, or Firm—Richard B. Smith

[57] ABSTRACT

Isolated Partial Scan (IPS) circuits and methods provide a partial scan technique in which no blocking or isolation circuitry is required and which requires little extra circuitry, reduces the amount of added circuitry and eliminates the need for circuit design restrictions that are common to conventional design for testability (DFT) methods. IPS ensures by construction that the state of non-scan sequential devices is not changed during the scan operations of scan sequential devices without the need to add disabling logic to protect or isolate the non-scan devices from the scan devices. A partial scan test circuit has sequential scan elements for directly replacing sequential logic elements within a circuit. Each scan element performs the same function of the replaced sequential element and includes a data input, a data output, a scan input, a scan output, and control signals for controlling the operation of the scan element, including normal, scan in and scan out operations. The data output of each scan element does not change state during scan in or scan out operations. IPS offers the advantages of: (1) little or no propagation delay penalty, so performance is preserved, (2) smaller circuitry for testability, since only a subset of the flip flops need be scanned, so less area penalty is incurred, and (3) no extra design rules are required so the designer is free to design in accordance with meeting design objectives.

6 Claims, 8 Drawing Sheets

PARTIAL SCAN LOGIC

This application is a continuation of application Ser. No. 08/568,733, filed Dec. 05, 1995, now abandoned.

FIELD OF THE INVENTION

This invention relates to a digital circuit design and method for improving the testability of integrated circuits.

BACKGROUND OF THE INVENTION

Digital integrated circuits contain many internal circuit elements or devices which must be tested to assure that the circuit elements are functioning correctly. These tests may need to be performed to assure that an integrated circuit has been manufactured correctly, or to assure that the integrated circuit is functioning correctly during its operation, e.g., through self-test routines on powering up the circuit or at certain test intervals. A test connection to each of the possibly millions of circuit elements on an integrated circuit would result in the requirement of a like number of connections to the integrated circuit to be tested, and would be virtually impossible to implement. Digital test elements have been built into integrated circuits to achieve testability through serially scanning the states of a sampling of the circuit elements. These techniques include "full scan" and "partial scan" test circuits.

Digital integrated circuits are composed of a number of individual circuit elements, some of which are combinatorial, such as AND or OR gates, and some are sequential, such as a level sensitive or edge triggered data storage flip flop. The output of a combinatorial device depends only on the current input values. Sequential devices have a memory capability, so that their output is a function of current input values and previous input values. Testing a digital circuit is performed by applying values to the circuit input signals and comparing the corresponding values produced at the circuit output signals with the values expected to be produced for a properly functioning circuit. The values applied to the circuit inputs, i.e., the "stimulus values," are selected to achieve predetermined values on the output signals, i.e., the "response values," of particular elements within the circuit if the circuit is operating correctly. In the event that there is a circuit defect associated with the circuit elements under test at the time the stimulus is applied, the actual response values resulting at the circuit output signals will be different from the response values expected for a fault free circuit.

Thorough testing of complex digital circuits usually requires a large number of stimulus/response value pairs. It is generally difficult to create the stimulus values for sequential circuits (i.e., a circuit containing sequential devices) because the values on the output signals of various elements within the circuit depend both on values currently being applied to the input signals of the circuit and on previous stimulus values. Full scan is a technique commonly used to improve testability in a sequential circuit by removing the dependency on previous input stimulus. Full scan involves replacing each sequential device in a circuit with a logically equivalent device and extra interconnecting logic so that the circuit can be operated in two modes, normal and test. In normal mode, the circuit performs its originally intended function. In test mode, the sequential devices in the circuit are reconfigured into one or more serial shift registers, called scan chains. The serial input to these serial shift registers can be applied from the circuit input signals. The serial output can be observed at the circuit output signals. While in test mode, values required on the output signals of the sequential devices can be achieved by alternately applying a value to the serial input signal(s) and values on certain test control signals to cause the serial values to shift through the various stages of the scan chains. The circuit is then placed in normal mode so that the circuit can respond to the values on the scan chain. While in normal mode, the values on the output signals of the scan chain elements may change in response to the current state and input values. The circuit is then returned to test mode where the state of the scan chain may be shifted out for comparison with an expected state and, simultaneously, new values shifted in. With such a scheme, a test for a specific fault on an element in the original circuit need only specify one set of values on the output signals of the sequential elements. The scan logic can be used to achieve those values without the need to understand the dependency of the outputs of the sequential devices on the previous system inputs to the sequential devices.

With full scan testing, extra logic elements are necessary to implement the test function and necessary normal and test mode controls. Often this extra logic exceeds the amount of chip area available for the required circuit. Partial scan techniques are an alternative for use in circuits where the requirements for full scan cannot be satisfied. These techniques are based on using a subset of the flip flops for interconnection into scan chains. The motivation for partial scan is based, in part, on the fact that scannable flip flops require more silicon area than non-scan flip flops and that extra routing area is needed for the scan connections to each scan flip flop.

Partial scan tests also operate the circuit in two modes. A test mode is used to configure the scannable flip flops into their partial scan chain configuration. The necessary serial data and associated shift clocks are applied to load the scan flip flops. The circuit is changed to normal mode and the input signals are changed to the values required for the next stimulus. The outputs of various elements in the circuit, including scan elements, will change their output values in response to the new scan state and new input values.

As in full scan, the scan flip flops in a partial scan design are easy to control and observe by means of the scan chain. The non-scan flip flops still function as a sequential circuit and so must be controlled and observed by applying sequences of input sets as well as scan chain loads. Because many faults require values from non-scan flip flops, tests in a partial scan circuit may require a number of input stimuli and scan chain loads to propagate fault effects from the site of a fault to either a circuit output signal for direct observation by a test machine or to a scan flip flop for subsequent observation on the next scan out. These stimuli and scan loads are used, in part, to control the non-scan flip flops. For example, consider a partial scan circuit that includes a binary counter. The circuit may contain circuit elements driven by both the counter and the partial scan chain. To properly tests those elements, as well as the counter itself, sequences of input values and scan loads may be required. Because scan chain elements are connected to both the counter and to other logic involved in a test for a particular fault, the operation of the scan chain to satisfy the state in the remainder of the circuit may disrupt the state requirements in the counter. In such cases, the scan chain is not useful in improving testability.

It is generally recognized that flip flops not included in the scan chain must be protected from changing state while the state of the scan chain is being changed. If such precautions are not taken, as illustrated in the above example, the state of non-scan flip flops may become unpredictable. A solution to this problem is to require blocking gates to isolate non-scan flip flops from the scan chain. In particular, blocking gates are necessary whenever the asynchronous inputs to non-scan flip flops, typically the direct set and clear and the clock input, are functions of the scan chain flip flops. The logic driving such asynchronous inputs is generally among the most timing critical in a complex circuit. Insertion of blocking gates into such places often seriously affects system performance. Therefore, there is a need for a partial scan technique in which no blocking or isolation circuitry is required.

SUMMARY OF THE INVENTION

The Isolated Partial Scan (IPS) circuits and methods of this invention provide a partial scan technique in which no blocking or isolation circuitry is required and which requires little extra circuitry. Advantageously, the invention reduces the amount of added circuitry and eliminates the need for circuit design restrictions that are common to conventional design for testability (DFT) methods. IPS ensures by construction that the state of non-scan sequential devices is not changed during the scan operations of scan sequential devices without the need to add disabling logic to protect or isolate the non-scan devices from the scan devices. The partial scan strategy of IPS prevents the output of the scan devices from changing during scan operations rather than preventing such changes from altering the state of non-scan elements.

In general, in one aspect, the invention features a partial scan test circuit having sequential scan elements for directly replacing sequential logic elements within a circuit. Each scan element performs the same function of the replaced sequential element and includes a data input, a data output, a scan input, a scan output, and control signals for controlling the operation of the scan element, including normal, scan in and scan out operations. The data output of each scan element does not change state during scan in or scan out operations.

In preferred embodiments of the invention, the IPS scan element includes a first scan flip flop having a data (D) input which is also the data (D) input to the scan element itself, a SCAN IN (SI) input which is also the SCAN IN (SI) input to the scan element itself, a data (Q) output which is also the SCAN OUT (SO) output of the scan element itself, and a SCAN ENABLE (SE) input which is also the SCAN ENABLE (SE) input for the scan element itself. The SCAN ENABLE (SE) input selects between the data input and the SCAN IN (SI) input signal for the first scan flip flop. The first scan flip flop is responsive to a TEST CLOCK (TCLK) signal for transferring either the D input or the SCAN IN (SI) input signal to the (Q) output of the first scan flip flop as determined by the logical state of the SCAN ENABLE (SE) input. The IPS scan element also includes a second scan flip flop having a data (D) input connected to the data (D) input of the first scan flip flop, a SCAN IN (SI) input connected to the Q output of the first scan flip flop, a data (Q) output which is also the data (Q) output of the IPS scan element, a SCAN ENABLE (SE) input which is also the TEST MODE SELECT (TMS) input for the IPS scan element and which selects between the D input and the SCAN IN (SI) input signals, a SET input which is also the SET input of the IPS scan element, and a RESET input which is also the RESET input for the IPS scan element. The second scan flip flop element is responsive to a clock (CLK) signal for transferring the logic state of either the D input or the SCAN IN (SI) input to the Q output of the second scan flip flop, and thus the Q output of the IPS scan element itself, as determined by the state of the TEST MODE SELECT (TMS) input.

In yet other preferred embodiments, the IPS scan element replaces a level sensitive flip flop or an edge triggered flip flop.

Thus, IPS offers the advantages of: (1) little or no propagation delay penalty, so performance is preserved, (2) smaller circuitry for testability, since only a subset of the flip flops need be scanned, so less area penalty is incurred, and (3) no extra design rules are required so the designer is free to design in accordance with meeting design objectives.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE PREFERRED EMBODIMENTS

Figure 1:
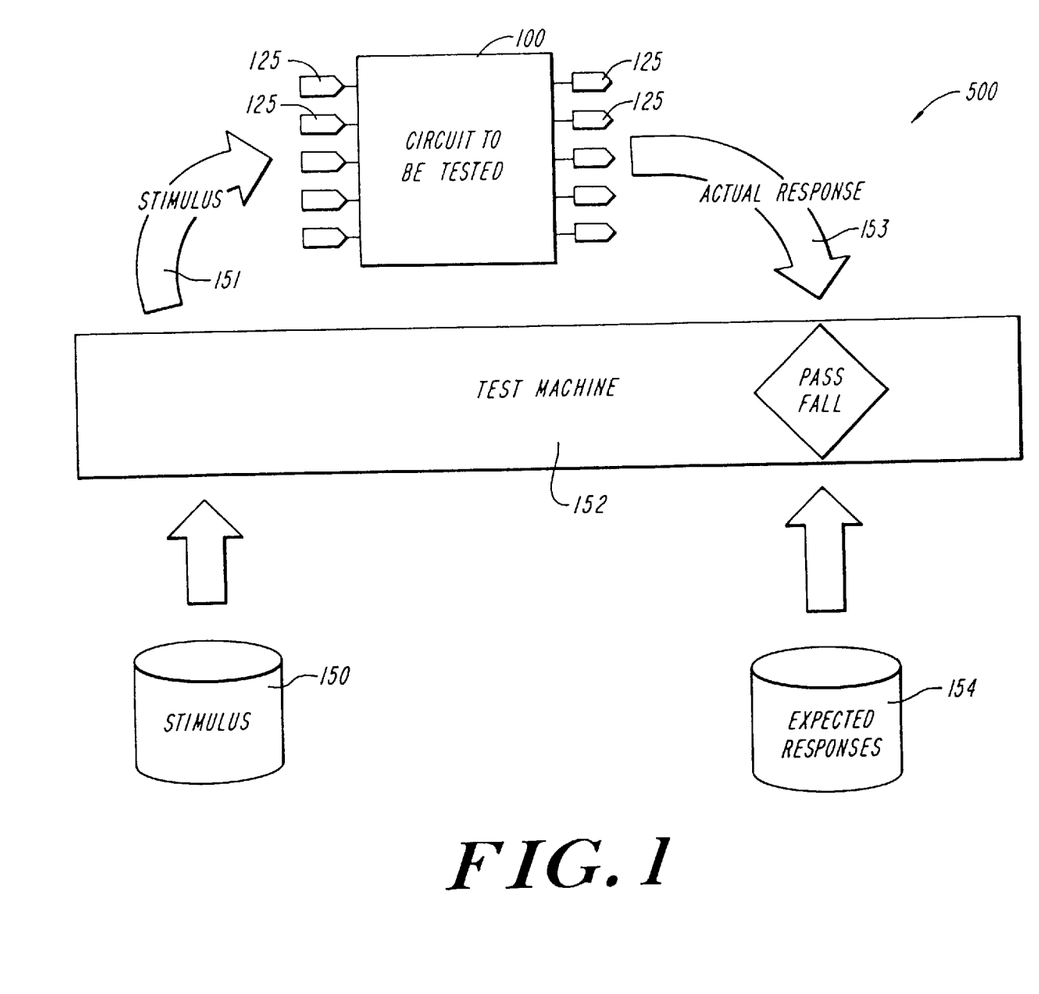
FIG. 1 is a block diagram of a system for implementing the isolated partial scan tests of this invention on a circuit under test.

Referring to FIG. 1, there is shown a system 500 for testing digital electronic circuit assemblies, such as circuit 100 through system signal connections 125 (e.g., input and output pins) and isolated partial scan elements. A test processor 152 has access to a database of stimulus values 150 which are applied 151 to the circuit under test 100 to cause an actual response 153 which can be read by the test processor 152. Test processor 152 also has access to a database of expected responses 154, associated with each stimulus value 150, against which each actual response 153 is compared to make a pass/fail 156 decision. The stimulus values are applied 151 to the circuit under test 100 by a combination of applying certain values to the system pins 125 and shifting certain values into place along scan chains composed of isolated partial scan elements of this invention as described below. The response values 153 can likewise be read back from circuit under test 100 by a combination of detecting response values at the system pins 125 and by scanning out response values appearing on the isolated partial scan elements of the scan chains.

Figure 2:
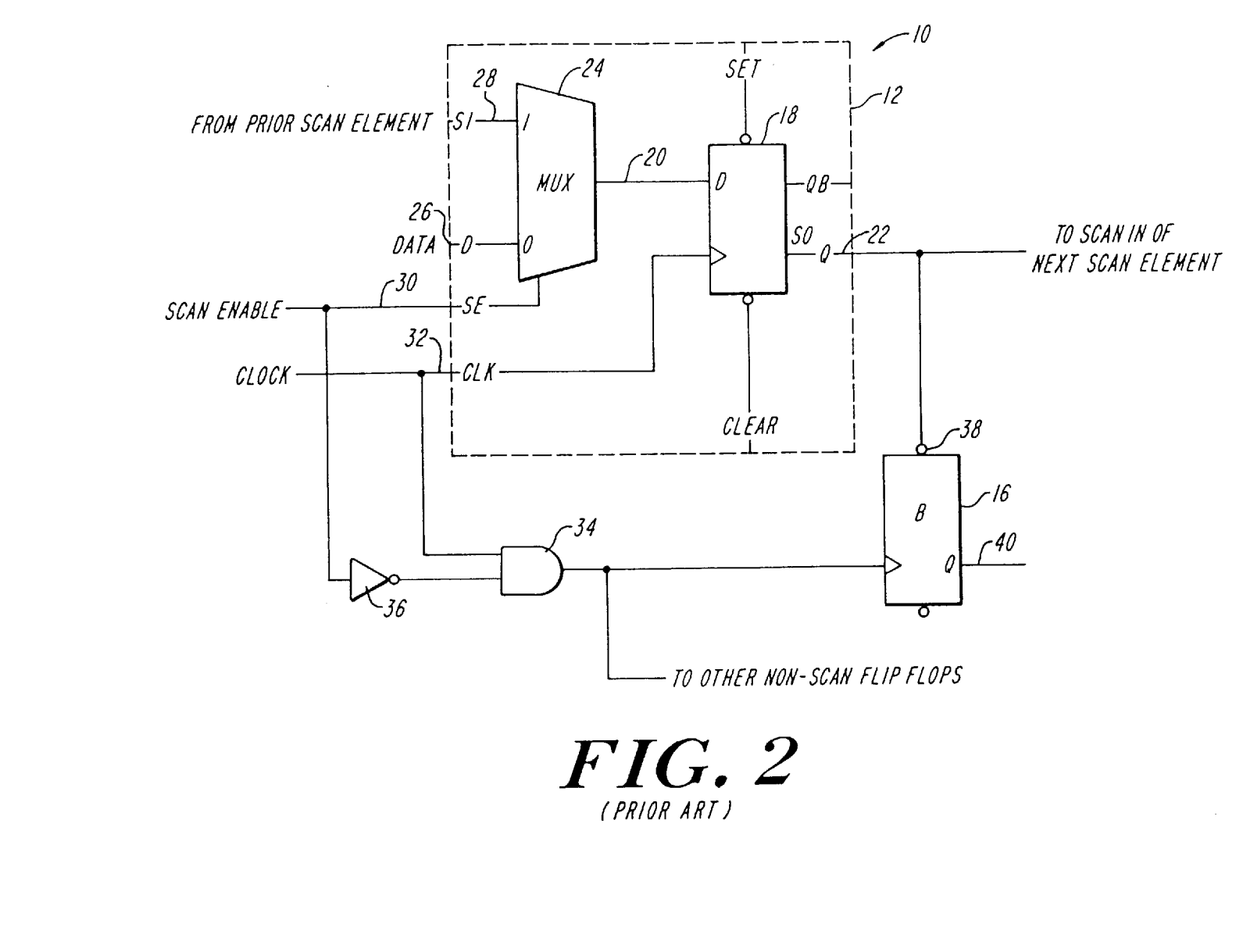
FIG. 2 is a schematic block diagram of a prior art partial scan circuit containing a conventional scan flip flop element connected to non-scan circuit elements.

Referring to FIG. 2, there is shown an example 10 of a prior art partial scan circuit containing a conventional scan flip flop element 12 connected to non-scan circuit elements including non-scan flip flop 16. Scan flip flop 12 includes a flip flop element 18 having a data (D) input 20 and a data (Q) output signal 22, which also serves as the SCAN OUT (SO) output of the scan flip flop 12. Scan flip flop 12 also includes a data multiplexer element 24 for selecting data to be applied to the D input 20 of flip flop 18 from the logic state of either the data (D) input 26 of the scan flip flop 12 or the SCAN IN (SI) input 28 from a prior scan flip flop in a serial scan chain. Multiplexer element 24 is controlled by a SCAN ENABLE (SE) input 30. A CLOCK (CLK) signal 32 controls the changing output state of flip flop 18, and is also applied to other non-scan circuit elements, such as flip flop 16. The logic circuitry 34 and 36 is used to disable the CLOCK (CLK) signal to non-scan elements when the SCAN ENABLE (SE) input 30 enables (logic high) a scan mode, thus preventing the non-scan logic from being clocked while the scan flip-flops are being scanned. The difficulty associated with the prior art circuit of FIG. 2 is that the Q output of flip flop element 18 is also the Q output signal 22 of scan flip flop 12, which may be connected to combinational logic or asynchronous inputs of synchronous devices, such as the SET input 38 of non-scan flip flop 16. Because the Q output signal 22 of flip flop element 18 is also the SCAN OUT (SO) output of the scan flip flop 12, the output will change state as scan data is scanned through the scan flip flop. In test mode, any zero state appearing on the Q output 22, and thus appearing at the SET input 38 of non-scan flip flop 16 will set the Q output 40 of non-scan flip flop 16 to a pre-determined state, thereby rendering the state of the non-scan flip flop 16, as well as other non-scan logic elements similarly affected, unpredictable.

Figure 3:
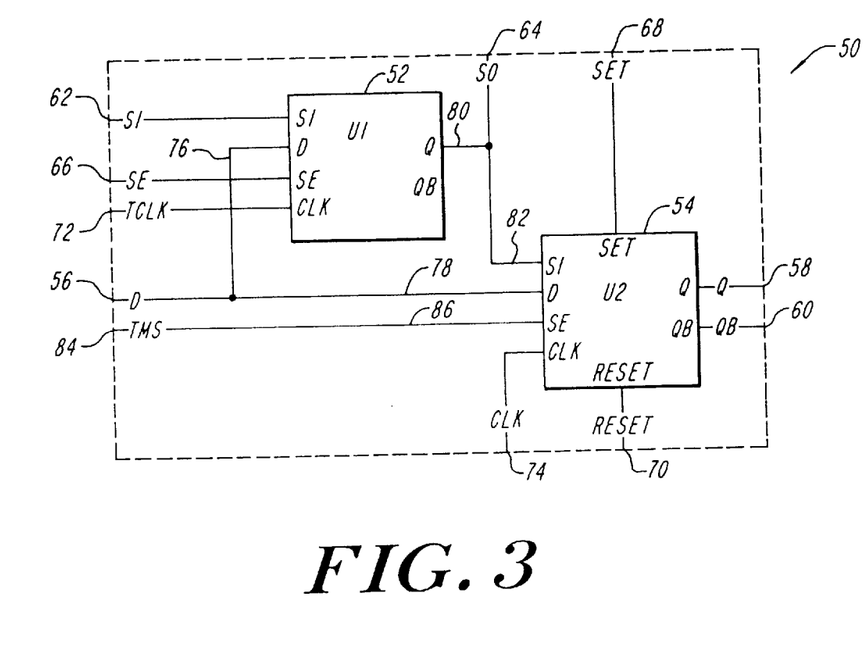
FIG. 3 is a schematic block diagram of a preferred embodiment of the isolated partial scan (IPS) flip flop circuit element of this invention for replacing non-scan circuit elements and for connection to other IPS flip flop circuit elements to form a scan chain.

Referring to FIG. 3, there is shown a preferred embodiment of an IPS scan flip flop element 50 of this invention for isolating the scan operation of the scan flip flop from the non-scan combinational and synchronous circuit elements to thereby prevent those non-scan elements from changing state during a scan operation. IPS Scan flip flop element 50 includes two conventional scan flip flop elements 52 and 54, such as scan flip flop element 12 of FIG. 2. IPS scan flip flop 50 includes a data (D) input 56, a data (Q) output 58, an inverted data (QB) output 60, a SCAN ENABLE (SE) input 66, a SCAN IN (SI) input 62 and a SCAN OUT (SO) output 64. SET input 68 and RESET input 70 directly control the state of Q output 58 and QB output 60. A TEST CLOCK (TCLK) input 72 controls the sequencing of the scan operations, while a CLOCK (CLK) input 74 controls the Q output 58 and QB output 60 of the scan flip flop 50. A TEST MODE SELECT (TMS) input controls the SCAN ENABLE input of scan flip flop element 54. The D input 56 of IPS scan flip flop 50 is also distributed to the D input 76 and 78 of each of scan flip flop elements 52 and 54, respectively. The Q output 80 of scan flip flop element 52 provides the SCAN OUT (SO) output 64 for IPS flip flop 50, as well as the SCAN IN (SI) input 82 for scan flip flop element 54.

In operation, an IPS scan flip flop 50 can be used to directly replace any flip flop element of the same type (i.e., edge-triggered or level sensitive) of an existing circuit to introduce testability to that element. To implement replacement, the D input 56, Q output 58, CLK input 74, SET input 68 and RESET input 70 directly replace the respective inputs and outputs of the flip flop element being replaced. When the TEST MODE SELECT (TMS) input 84 of IPS scan flip flop 50 is disabled (logic low), i.e., normal mode, the IPS scan flip flop 50 operates in accordance with its intended normal function. This is, input data arising on D input 56 is applied to the D input 78 of scan flip flop 54 which, because its SCAN ENABLE input 86 is disabled (logic low), routes the logic level on the D input 56, 78 to the Q output 58 (and the inversion of the logic level to the QB output 60) of IPS scan flip flop 50 in response to CLK 74 in the normal manner. Thus, data on the D input of the IPS scan flip flop 50 experience the normal propagation delay associated with a single scan flip flop element 12 of FIG. 2 which, for example, for the scan element 12 shown in FIG. 2, is equal to the addition of a multiplexer 24 on the D input of a standard flip flop element. One skilled in the art will appreciate that the resulting propagation delay will depend on the internal structure of the scan element being used.

When the TEST MODE SELECT (TMS) input 84 of IPS scan flip flop is enabled (logic high), i.e., test mode, the IPS flip flop 50 operates as a scannable flip flop and scan data on SCAN IN (SI) input 62 is clocked through scan flip flop element 52 by means of TEST CLOCK (TCLK) 72. While SCAN ENABLE (SE) 66 is enabled, the serial scan data on SCAN IN (SI) input 62 is serially shifted through scan flip flop 52 to the SCAN OUT (SO) output 64 and to the SCAN IN (SI) input 82 of scan flip flop 54 by means of TEST CLOCK (TCLK) 72. The data appearing on the SCAN IN (SI) input 82 is not transferred to the Q output 58 of IPS scan flip flop 50 until the occurrence of a CLOCK (CLK) 74 clock signal at scan flip flop 54. The result is that scan data can be shifted through each IPS scan element in a scan chain, either to load stimulus values or to retrieve response values, without affecting the state of the Q or QB output of the IPS scan flip flop element. This is because the IPS scan flip flop element outputs Q and QB only change state in response to a change in the state of system clock CLK 74. IPS scan operations will change the state of data input 82 to the scan flip flop 54, but, the state of the clock input to scan flip flop 54 is independent of the values being shifted through the scan chain and the values applied to scan control inputs SE and TCLK. Therefore, the Q 58 and QB 60 outputs of all IPS scan flip flop elements will change only in response to appropriate changes to system input pins 125, which are held in a fixed state during IPS scan operations. Thus, the IPS scan operation is effectively isolated from the non-scan elements of the circuit under test.

Figure 4:
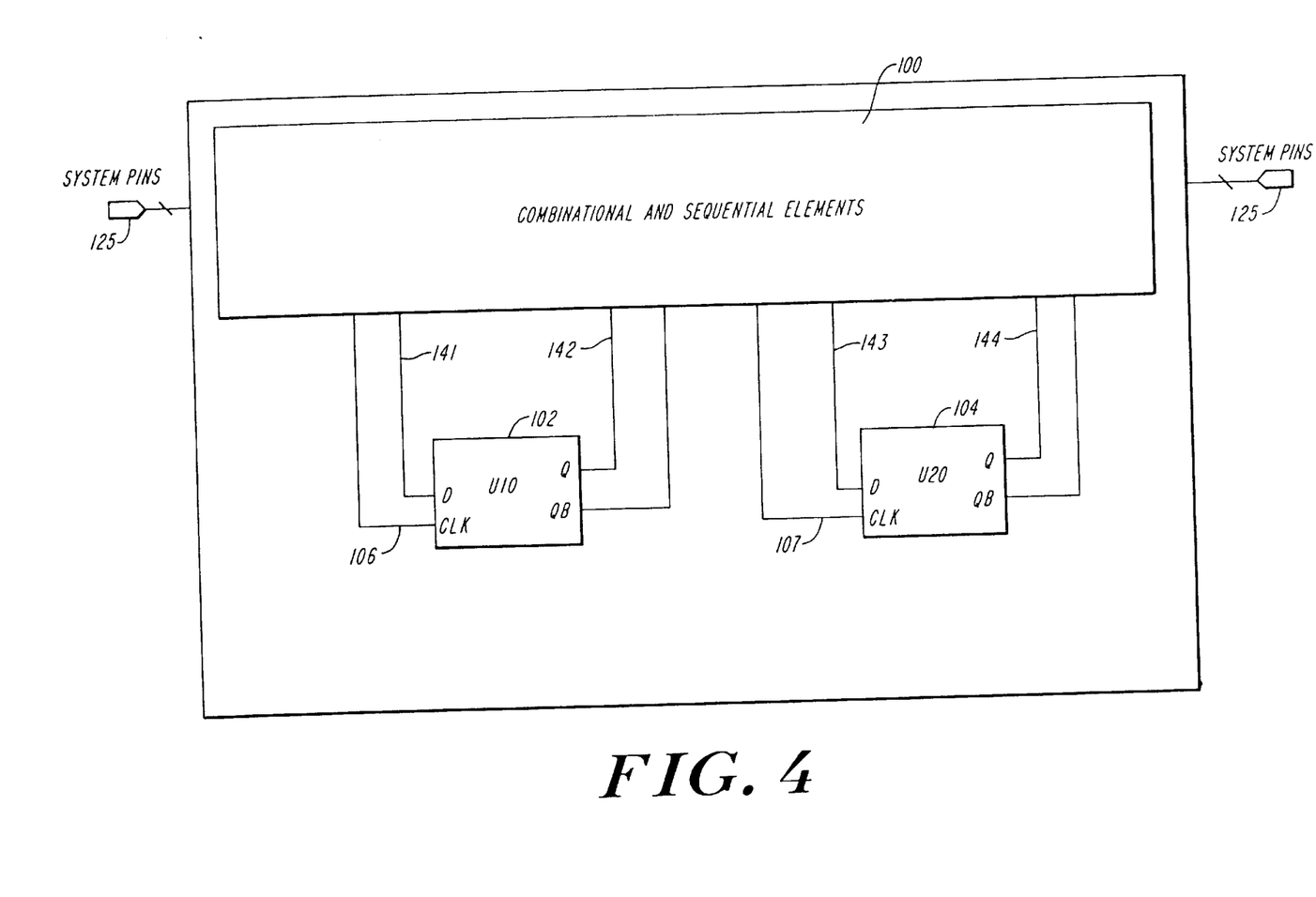
FIG. 4 is a schematic block diagram illustrating a sequential circuit in which two sequential flip flop elements are shown.
Figure 5:
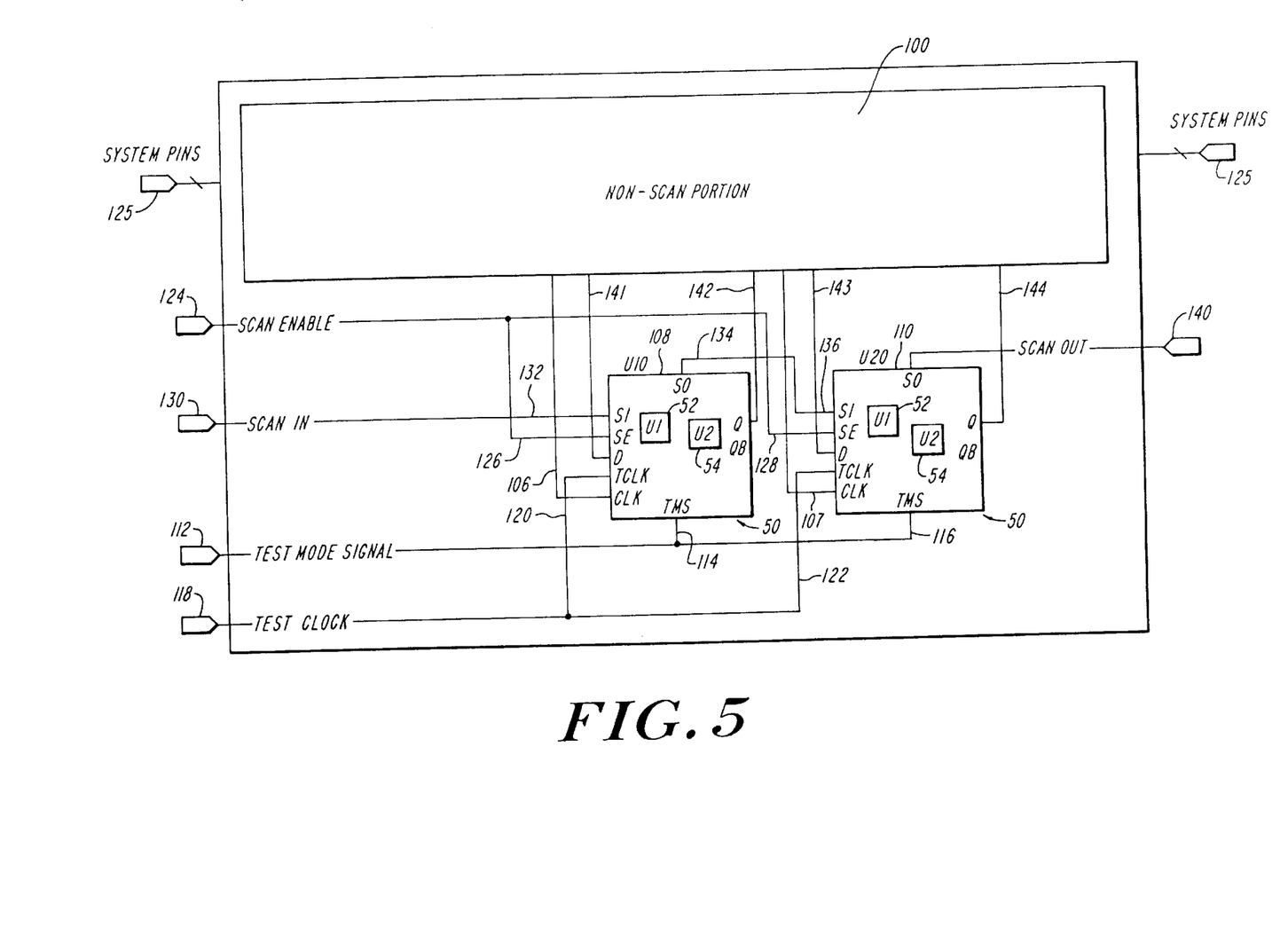
FIG. 5 is a schematic block diagram showing the replacement of each of the two sequential flip flop elements of FIG. 4 with an IPS scan flip flop element of FIG. 3 configured as a two element scan chain of IPS scan flip flop elements.

Referring to FIG. 4, there is shown a schematic diagram of combinational and sequential integrated circuit elements 100 including typical sequential flip flop circuit elements 102 and 104 (which are shown as removed from the other circuit elements 100 for illustrative purposes). Flip flops 102 and 104 are driven by clocks 106 and 107, respectively. Referring also now to FIG. 5, each of the sequential flip flop elements 102 and 104 of FIG. 4 are replaced with an IPS scan flip flop 108 and 110, respectively, of this invention to implement a scan chain to add testability to the circuit elements 100. It should be noted that although only two sequential elements of the circuits 100 are shown being replaced with IPS scan elements in FIG. 5 to form a two element scan chain, any number of the sequential elements of integrated circuit elements 100 can be replaced by IPS scan elements and included in the scan chain. Thus, IPS scan elements can be added throughout the sequential circuitry to add testability as required to circuits 100 without affecting the functionality of the sequential circuit elements being replaced.

System clock signals 106 and 107 drive the IPS scan flip flops 108 and 110, respectively, during normal system operation. A TEST MODE SELECT (TMS) signal 112 drives the TEST MODE SELECT (TMS) input 114 and 116, respectively, of IPS scan flip flop 108 and 110. A TEST CLOCK (TCLK) signal 118 drives the TEST CLOCK (TCLK) input 120 and 122, respectively, of scan flip flop 108 and 110. A SCAN ENABLE (SE) signal 124 drives the SCAN ENABLE (SE) input 126 and 128, respectively, of scan elements 108 and 110. A SCAN IN (SI) signal 130, which carries values to be scanned into the IPS scan flip flop elements of the scan chain, drives the SCAN IN (SI) input 132 of one IPS scan element 108 (i.e., the first IPS scan flip flop element in the scan chain). The SCAN OUT (SO) output 134 of IPS scan element 108 drives the SCAN IN (SI) input 136 of the next IPS scan element 110 in the scan chain. The SCAN OUT (SO) output 138 of IPS scan element 110 (i.e., the last IPS scan element in the scan chain) generates a SCAN OUT (SO) signal 140, which carries values scanned out of the scan chain. It should be noted that any quantity of IPS scan elements could be inserted into the scan chain between the first and last IPS scan elements, with the SCAN OUT (SO) output of an element connected to the SCAN IN (SI) input of the next element in the scan chain.

Figure 6:
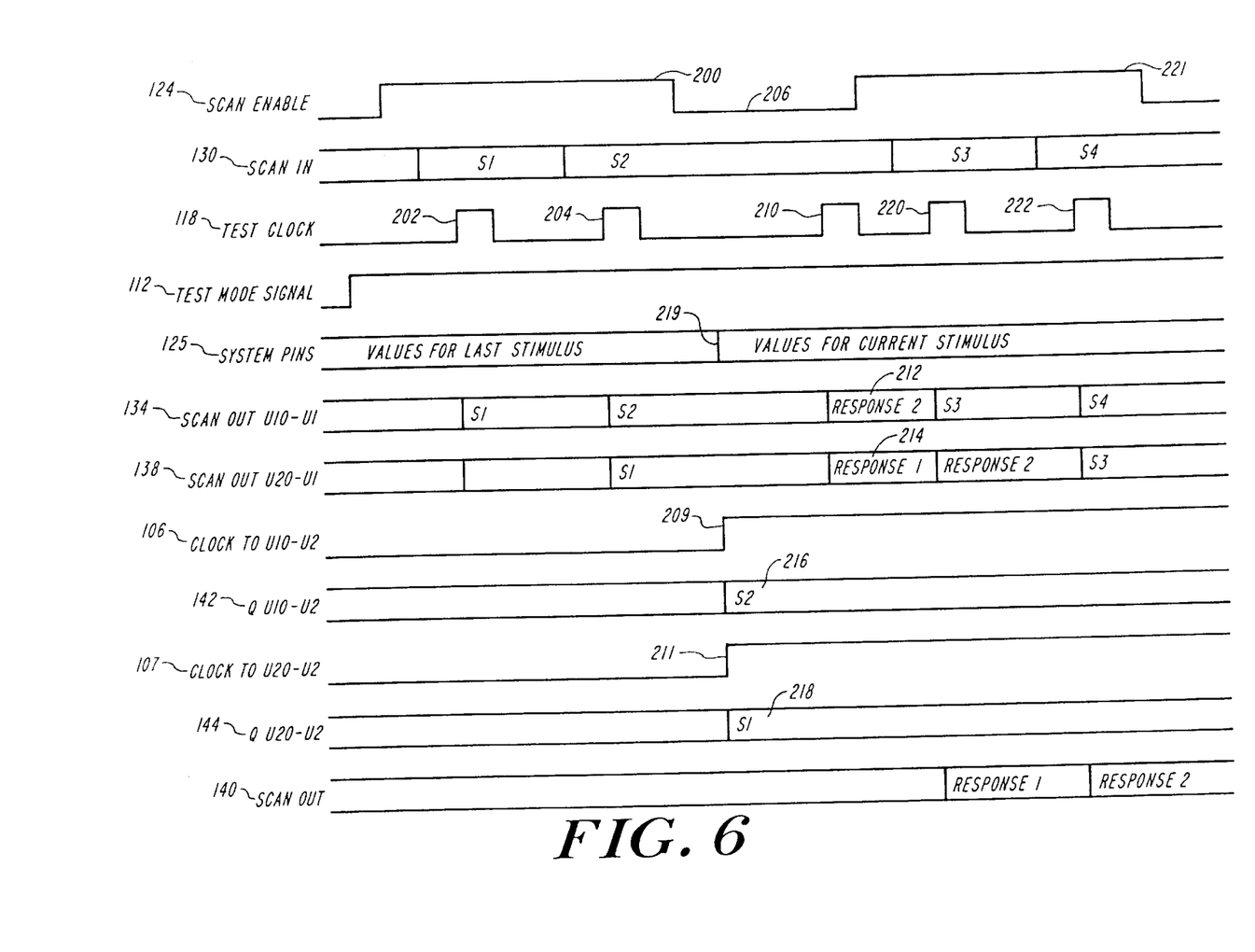
FIG. 6 is a digital timing diagram illustrating the operation of the IPS scan flip flop elements of FIG. 5 during the loading of stimulus values into the IPS scan flip flop elements and the read back of response values from the IPS scan flip flop elements.

Referring to FIG. 6, there is shown a timing diagram illustrative of the operation of the IPS scan elements 108 and 110 of FIG. 5 within a scan chain. A typical IPS test operation involves three steps: (1) loading stimulus values by a test processor into the IPS scan elements by sequentially shifting stimulus value data through the elements of the scan chain, (2) stimulating the circuit elements under test with the external circuit input pins 125 and with the stimulus values loaded into the IPS scan elements of the scan chain once the stimulus values are properly shifted into place and aligned on the proper IPS scan elements along the scan chain, and (3) reading the response values of the circuit elements under test by sequentially shifting the response values appearing at the IPS scan elements out of the scan chain for readback and comparison with expected response values by a test processor.

With reference to the timing diagram, and assuming positive edge-triggered devices, stimulus values are sequentially loaded into the scan elements by first enabling (logic high) 200 the SCAN ENABLE (SE) input 124 and enabling (logic high) 201 the TEST MODE SELECT (TMS) input 112. Stimulus values S1 and S2 are presented on SCAN IN (SI) input 130, and clocked into the scan elements by means of TEST CLOCK (TCLK) 118 leading edges 202, 204. TEST CLOCK (TCLK) edge 202 causes stimulus value S1 to appear on the SCAN OUT (SO) output 134 of scan element 108. TEST CLOCK (TCLK) edge 204 causes stimulus value S1 to appear on the SCAN OUT (SO) output 138 of scan element 110, and stimulus value S2 to appear on the SCAN OUT (SO) output 134 of scan element 108. Stimulus values S1 and S2 will only appear on the Q outputs 142, 144 of the scan elements 108, 110, respectively, upon (i) the SCAN ENABLE (SE) 124 input being disabled (logic low) 206, and (ii) the occurrence of system clock transitions 209 and 211 of clocks 106 and 107, respectively, in response to changes 219 to system pins 125. It should be noted that although clocks 106 and 107 are both shown responding to changes 219 in system pins 125, these clocks can be configured to operate independently of each other, with each responding to a particular set of changes 219 in system pins 125. With the SCAN ENABLE (SE) input 124 in the disabled state 206, the occurrence of a TEST CLOCK (TCLK) 118 edge 210 causes the scan flip flops 108 and 110 to sample the response values on their respective D inputs and transfer such response values 212 and 214 to their respective SCAN OUT (SO) inputs 134 and 138, without changing the state 216 and 218 of the Q output signals 142 and 144, of the scan flip flops 108 and 110, respectively. By enabling 221 the SCAN ENABLE (SE) input 124, response values can be scanned out of the IPS scan flip flops, and new stimulus values S3 and S4 can be scanned into the IPS scan flip flops by means of TEST CLOCK (TCLK) 118 clock pulses 220 and 222. The process can then be repeated for the new stimulus values.

Figure 7:
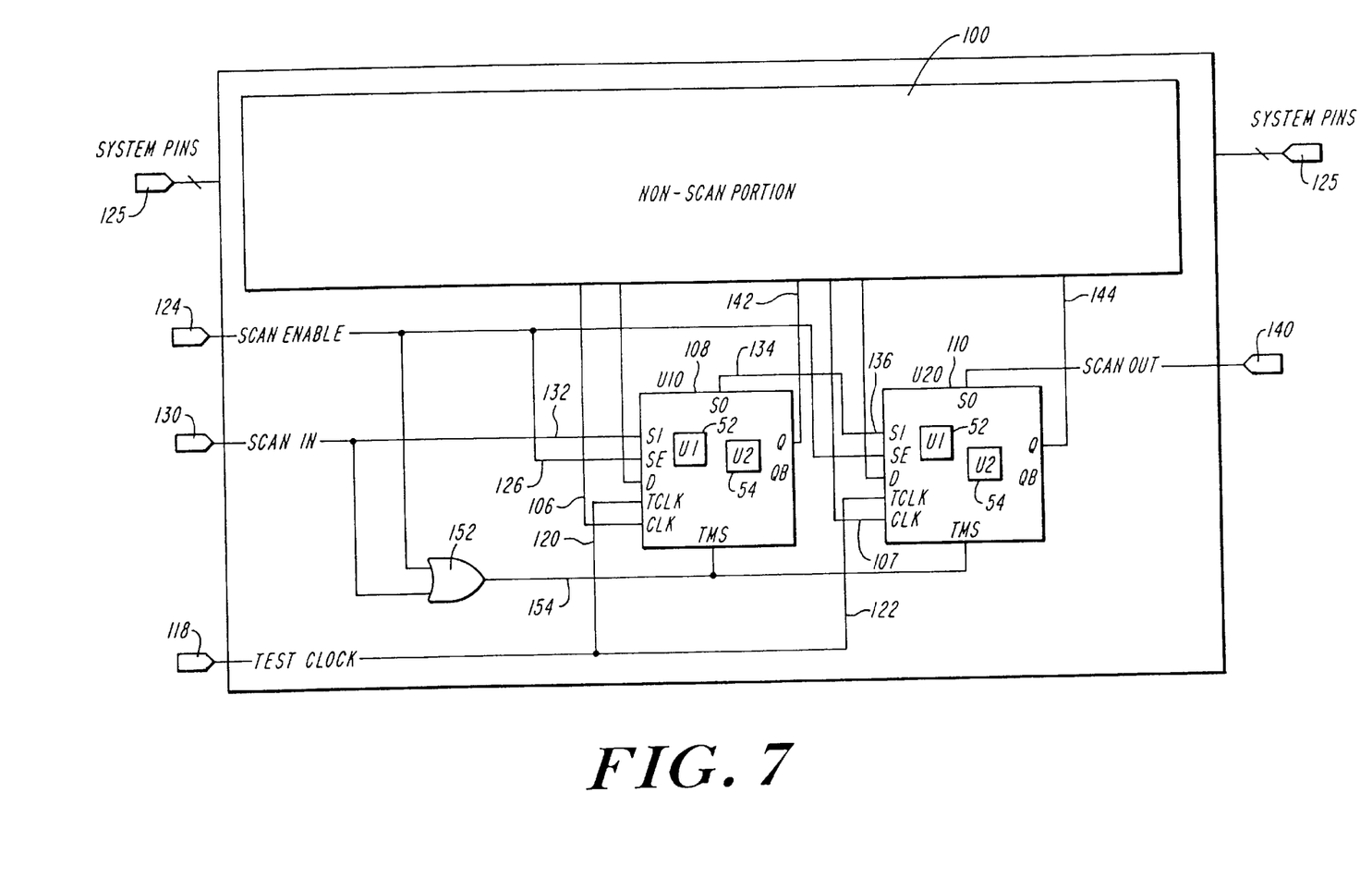
FIG. 7 is a schematic block diagram of the embodiment of FIG. 5 modified to reduce the quantity of external test connections.

Referring to FIG. 7, there is shown another preferred embodiment of an implementation of the IPS scan flip flop of this invention featuring fewer external pins, i.e., eliminating the TEST MODE SELECT (TMS) input 112 from the preferred embodiment of FIG. 5. The TEST MODE SELECT (TMS) 112 can be eliminated by taking advantage of the fact that when SCAN ENABLE (SE) 124 is disabled, the SCAN IN (SI) input 130 is in a don't care state. By ensuring that the stimulus values always drive the SCAN IN (SI) input 130 to an enabled state before disabling SCAN ENABLED (SE) input 124, the TEST MODE SELECT (TMS) input can be replaced by a logical OR function 152 of the SCAN ENABLE (SE) input and SCAN IN (SI) input signals, the output 154 of which drives the TEST MODE SELECT (TMS) inputs of scan flip flops 108 and 110.

Figure 8:
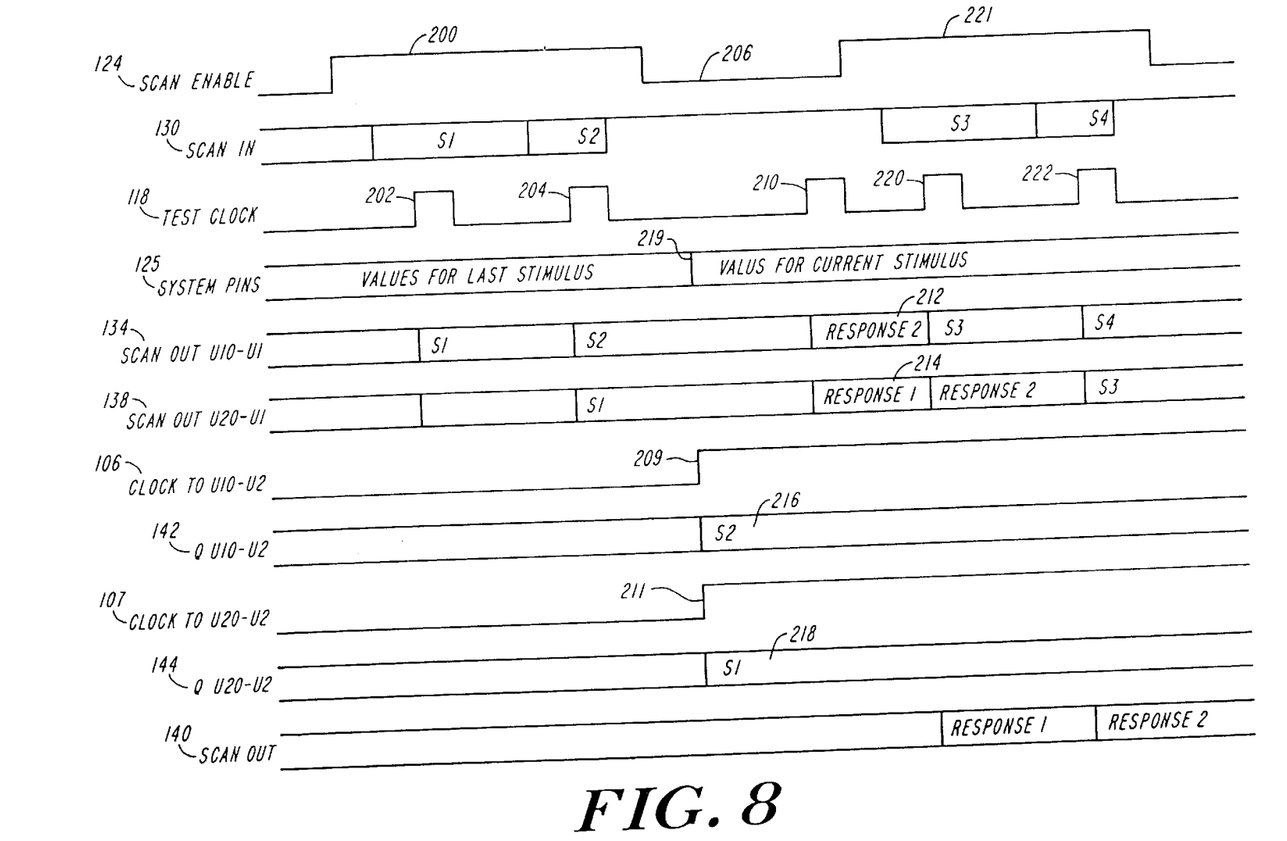
FIG. 8 is a digital timing diagram illustrating the operation of the IPS flip flop elements of FIG. 7 during the loading of stimulus values into the IPS scan flip flop elements and the read back of response values from the IPS scan flip flop elements.

Referring to FIG. 8, there is shown an illustrative timing diagram for the embodiment of FIG. 7. In a normal system operational mode, and for the positive logic OR function 152 shown in FIG. 7, the SCAN ENABLE (SE) 124 and SCAN IN (SI) 130 signals are held low, resulting in OR function output 154 driving the TEST MODE SELECT (TMS) inputs of the scan flip flops to remain disabled (logic low) thereby ensuing normal mode operation of the scan flip flops. In test mode, the input stimulus values on the SCAN IN (SI) or SCAN ENABLE (SE) signals are forced to an enabled (logic high) state so that the TMS input to each scan flip flop will be in a logical enabled state.

Equivalents

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A partial scan circuit, comprising
a sequential scan element for arbitrarily performing either a scan function or a synchronous logic function for the circuit as determined by the state of a scan control signal, the scan element performing the synchronous logic function responsive to a system clock and performing the scan function responsive to a test clock, and the scan element comprising a data input for the synchronous logic function, a data output for the synchronous logic function, a scan input for the scan function, a scan output for the scan function, and a system clock input, a test clock input and control signal inputs for controlling the operation of the scan element including the synchronous logic function and the scan function, wherein the data output of the synchronous logic function of the scan element is electrically isolated from the scan output of the scan function and the data output of the synchronous logic function does not change state during performance of the scan function.

2. The partial scan circuit of claim 1, wherein the scan element comprises a first flip flop element having a data input which is the data input of the synchronous logic function, a scan input which is the scan input of the scan function, a Q output which is the scan output of the scan function, a test clock input which is the input for a test clock signal for the scan function, and an enable signal input which enables the scan function and selects between the data input and the scan input for input to the first flip flop element in response to the state of the enable signal as determined by a test processor, the first flip flop element being responsive to the test clock signal for transferring either the data input to the Q output of the first flip flop element, or the scan input to the Q output of the first flip flop element as determined by the state of the enable signal input, a second flip flop element having a data input connected to the data input of the first flip flop element and which is the data input of the synchronous logic function, a scan input connected to the Q output of the first flip flop element, a Q output which is the data output of the synchronous logic function, a system clock input which is the input for a system clock signal for the synchronous logic function, and a test mode select input which selects between the data input and the scan input for input to the second flip flop element in response to the state of the test mode select input as determined by the test processor, the second flip flop element being responsive to the system clock signal for transferring either the data input of the second flip flop element or the scan input of the second flip flop element to the Q output of the second flip flop element as determined by the state of the test mode select input.

3. The partial scan circuit of claim 1 wherein the scan element performs the synchronous logic function of a level sensitive flip flop.

4. The partial scan circuit of claim 1 wherein the scan element performs the synchronous logic function of an edge triggered flip flop.

5. The partial scan circuit of claim 1 wherein the system clock is directly connected to the system clock input to the scan element.

6. The partial scan circuit of claim 1 wherein the control signal input comprise asynchronous control lines are directly connected to the corresponding asynchronous control lines of the scan element.

* * * * *